United States Patent [19]

Hernandez et al.

[11] Patent Number: 4,748,537

[45] Date of Patent: May 31, 1988

[54] DECOUPLING CAPACITOR AND METHOD OF FORMATION THEREOF

[75] Inventors: Jorge M. Hernandez; Rodney W. Larson, both of Mesa, Ariz.

[73] Assignee: Rogers Corporation, Rogers, Conn.

[21] Appl. No.: 94,441

[22] Filed: Sep. 8, 1987

Related U.S. Application Data

[63] Continuation of Ser. No. 839,686, Apr. 24, 1986, abandoned, which is a continuation-in-part of Ser. No. 730,468, May 3, 1985.

[51] Int. Cl.⁴ .................... H01G 1/14; H01G 7/00; H01B 7/00
[52] U.S. Cl. .................... 361/306; 29/25.42; 174/72 B
[58] Field of Search .......... 174/52 FP, 72 B; 361/306; 29/25.42

[56] References Cited

U.S. PATENT DOCUMENTS

| | | | |
|---|---|---|---|
| 3,544,857 | 12/1970 | Byrne et al. | 174/52 FP X |
| 3,880,493 | 4/1975 | Lockhart | 361/306 X |
| 4,168,520 | 9/1979 | Coleman et al. | 361/306 X |
| 4,266,091 | 5/1981 | Fukuda | 361/306 X |
| 4,399,321 | 8/1983 | Gottlieb | 174/72 B |
| 4,461,924 | 7/1984 | Butt | 174/52 FP |
| 4,475,143 | 10/1984 | Hernandez | 29/25.42 X |
| 4,491,895 | 1/1985 | Gottlieb et al. | 29/25.42 X |
| 4,517,406 | 5/1985 | Erdle | 174/72 B |

Primary Examiner—Donald A. Griffin
Attorney, Agent, or Firm—Fishman, Dionne & Cantor

[57] ABSTRACT

A hermetically sealed and automatically insertable decoupling capacitor for use in conjunction with integrated circuit DIP inserter devices having a multi-layer ceramic capacitor chip provided with conductive electrodes on the top and bottom surfaces thereof sandwiched between suitable conductive strips and insulating layers and retained within an opening formed in an insulating strip by solder or conductive adhesive. The multi-layer ceramic capacitor further includes conductive end terminations having insulative caps thereon to prevent shorting.

63 Claims, 10 Drawing Sheets

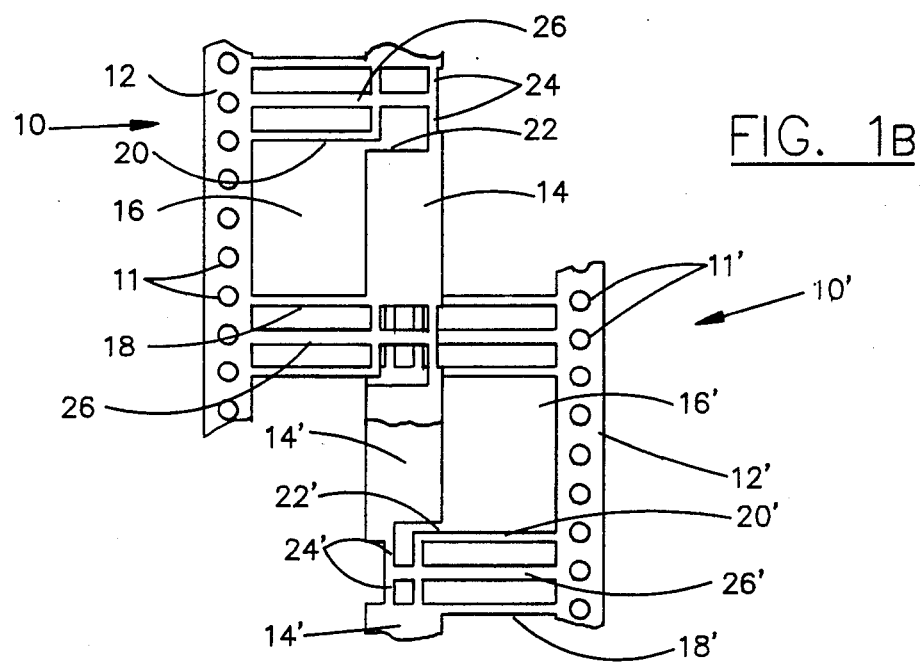
FIG. 1A
FIG. 1B
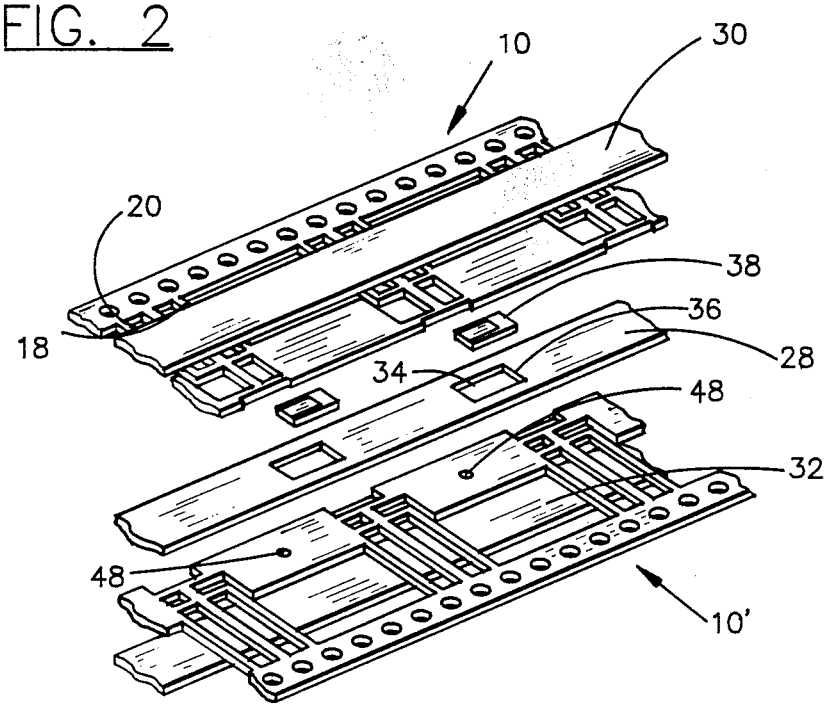
FIG. 2

DECOUPLING CAPACITOR AND METHOD OF FORMATION THEREOF

CROSS-REFERENCE TO RELATED APPLICATION:

This application is a continuation of application of Ser. No. 839,686, filed Apr. 24, 1986 and now abandoned which is a continuation-in-part of U.S. application Ser. No. 730,468 filed May 3, 1985.

BACKGROUND OF THE INVENTION

This invention relates to the field of decoupling capacitors for integrated circuits. More particularly, this invention relates to a novel and improved decoupling capacitor, and method of formation thereof wherein the capacitors are formed from a pair of lead frames disposed in a parallel orientation and including multi-layer ceramic capacitor chips having top and bottom electrodes. This dual lead frame construction and specially configured multi-layer capacitor chip permits the decoupling capacitor to be formed from a lamination process without the use of any molding to form decoupling capacitors which are auto-insertable into printed circuit boards for use in conjunction with dual-in-line integrated circuits or other electronic components.

U.S. Pat. No. 4,502,101 (which is assigned to the assignee hereof, and the entire contents of which are incorporated herein by reference) discloses a decoupling capacitor for an integrated circuit package. The decoupling capacitor of that prior patent is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bend downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground and power supply conductors are connected. The associated integrated circuit or other electronic component is then positioned over the capacitor and inserted into the board such that the power supply leads of the integrated circuit or other component will be positioned in the same through holes of the printed circuit board in which the two capacitor leads have been inserted.

The diagonally located leads or pins on the decoupling capacitor of U.S. Pat. No. 4,502,101 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent terminal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior U.S. Pat. No. 4,502,101 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

A need also exists for a decoupling capacitor structure which is also auto-insertable, hermetically sealed, and capable of being manufactured by automated assembly processes.

U.S. Pat. No. 4,475,143 (assigned to the assignee hereof) discloses one approach to solving the above discussed auto-insertion problem by the incorporation of dummy or stabilizing pins in a decoupling capacitor assembly. U.S. Pat. Nos. 4,491,895, 4,494,169, 4,494,170, 4,497,012, 4,511,951, 4,532,572, and U.S. patent application Ser. No. 711,393 to Kask, Hernandez and Watson filed on Mar. 13, 1985, now U.S. Pat. No. 4,630,170 issued Dec. 16, 1986, all of which are assigned to the assignee hereof, present other constructions of and methods for forming decoupling capacitors with dummy pins or molded stabilizing lugs.

Presently used manufacturing procedures for decoupling capacitors of the type hereinabove discussed (i.e., which include dummy leads) are not particularly well suited for incorporating multi-layer monolithic ceramic capacitor chips as the capacitive element for the decoupling capacitor device. In effect then, this situation limits the capacitive element to be a single layer capacitor of limited obtainable capacitance per unit volume. However, a method of manufacturing decoupling capacitors with multi-layer ceramic capacitor chips with only two leads (i.e., no dummy leads) is disclosed in U.S. patent application Ser. No. 690,117, now U.S. Pat. No. 4,584,627, which is assigned to the assignee hereof and incorporated herein by reference. An alternative method of manufacturing a decoupling capacitor having four leads and with multi-layer ceramic chips is disclosed in U.S. patent application Ser. No. 711,478 to Schilling, Jodoin and Johnston filed on Mar. 13, 1985 now U.S. Pat. No. 4,622,619.

Many of these prior art methods of manufacturing decoupling capacitors utilize encapsulating molding as a technique in providing hermetically sealed components. One of the problems associated with conventional multi-layer ceramic capacitors using either transfer or injection molding, is the resultant relatively small total package thickness of about 0.045 inch (including stand-offs). This leads to a package wall thickness of about 0.008–0.010 inch, which is quite difficult to consistently provide using conventional state of the art molding methods.

It should be understood that there is a need for efficient and economical decoupling capacitors and methods of manufacture thereof having higher capacitance volumes for use in decoupling the new generation of integrated circuit devices, which are faster and consume more power (i.e., 256K memory integrated circuits). One attempt at overcoming some of the above-discussed problems is disclosed in co-pending U.S. patent application Ser. No. 730,278, filed May 3, 1985 now U.S. Pat. No. 4,594,641.

SUMMARY OF THE INVENTION

The above discussed and other problems of the prior art are overcome or substantially reduced by the new and improved decoupling capacitor of the present invention and the method of manufacture thereof; and a novel multilayer ceramic capacitor chip construction. The decoupling capacitor of the present invention is formed from a laminated structure consisting of a pair of lead frames having a parallel orientation and a specially adapted multi-layer capacitor chip with top and bottom conductive electrodes. The use of such a laminated structure provides a low cost, auto-insertable and reliable decoupling capacitor which includes high capacitance values as well as other desirable properties such as temperature stability of capacitance, as a result of the incorporation of multi-layer capacitor chips. The present invention thus presents a construction of and method for forming improved decoupling capacitors which are hermetically sealed, auto-insertable and manufactured in a pair of lead frames followed by a lamination process.

In accordance with the method of the present invention, a conductor having a lead connected thereto is formed from a continuous strip of electrically conductive material, the strip having opposing planar surfaces. A dummy lead, associated with the conductor, but isolated therefrom, is also formed from the strip. Two such strips (lead frames) are then spaced apart in a parallel orientation and a strip of insulating material having a plurality of openings or windows therein is sandwiched between the two lead frames. A multi-layer ceramic capacitor chip having conductive electrodes on the top and bottom surfaces thereof is inserted into each window so that the top and bottom electrodes respectively contact a conductor from each lead frame. Preferably, conductive epoxy is used to effect an electrical and mechanical connection between the capacitor chip electrodes and the lead frame conductors. Thereafter, a top strip of outer insulating material is positioned across from one opposing surface of a first conductive strip and a bottom strip of outer insulating material is positiooed on another opposing surface of a second conductive strip. The top and bottom outer insulating layers sandwiching the pair of parallel conductive strips are then heat tacked and hot press laminated to form a continuous strip of laminated material. It will be appreciated that suitable adhesive coating is provided to the several layered components during assembly and prior to lamination; the adhesive being cured during lamination. Finally, the now sealed and laminated decoupling capacitor is severed from the pair of lead frames. The decoupling capacitor of the present invention will thus be both hermetically sealed and automatically insertable for use in conjunction with integrated circuit DIP inserter devices.

The above discussed and other features and advantages of the present invention will be apparent to and understood by those skilled in the art from the following detailed description and drawings.

BRIEF DESCRIPTION OF THE DRAWINGS

FIG. 1A is a plan view of a top lead frame used in forming a decoupling capacitor having a multi-layer ceramic chip therein in accordance with the present invention;

FIG. 1B is a plan view of a bottom lead frame used in forming a decoupling capacitor having a multi-layer chip capacitor therein in accordance with the present invention;

FIG. 2 is an exploded perspective view of the component layers used in forming a decoupling capacitor in accordance with the present invention prior to lamination;

DESCRIPTION OF THE PREFERRED EMBODIMENT

Figure 3:
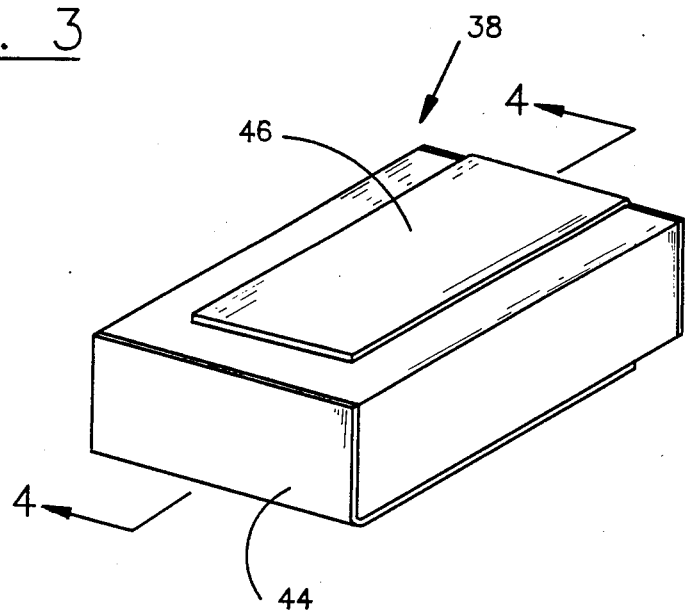
FIG. 3 is a perspective view of a multi-layer ceramic capacitor chip (MLC) used in forming a decoupling capacitor in accordance with the present invention.

The present invention presents a construction of and method for forming improved decoupling capacitors which are hermetically sealed, auto-insertable and manufactured in a lamination process.

Referring first to FIG. 1A, a first or top lead frame used in accordance with the present invention is shown generally at 10. Top lead frame 10 is a continuous planar strip of conductive material i.e., copper, which is provided with openings 11 along one side edge or carrier strip thereof for registration and transport. It will be appreciated that FIG. 1 shows only a small portion of a lead frame which is suitable for forming three decoupling capacitors in accordance with the present invention. It will further be appreciated that lead frame 10 is preferably a stamped part wherein all the components thereof are rigid. Thus, the desired lead frame configuration is formed by removing unwanted material from the strip of conductive material using any suitable and conventional technique.

Lead frame 10 includes a top conductor body portion 14 and is isolated from edge strip 12 by substantially rectangular opening 16. Conductor 14 includes an electrically active pin or lead 18 integrally attached thereto and an electrically inactive dummy pin or lead 20 which projects into opening 16 and is isolated from conductor 14 by a space 22.

Similarly, bottom lead frame 10' is a continuous planar strip of conductive material, i.e., copper which is provided with openings 11' along one side edge or carrier strip 12' thereof for registration and transport. Bottom lead frame 10' also has a conductor 14' and includes an electrically active pin or lead 18' which is integrally attached thereto and an electrically inactive dummy pin or lead 20' which projects into opening 16' and is separated from conductor 14' by a space 22'. It will be appreciated that conductors 14 and 14' are supported within lead frame 10 and 10', i.e., on edge portions 12 and 12', by active leads 18 and 18' and conductor extensions 24 and 24' which are attached to continuous lateral support structures 26 and 26', respectively. Note that inactive leads 20 and 20' are supported and attached between the respective edge portions 12 and 12' of lead frame 10 and 10' and lateral support structures 26 and 26'. Finally, lead frame 10 should also include stand-off means 27 (FIG. 5), i.e., dimples for spacing back the decoupling capacitor from the circuit board.

Referring now to FIG. 2 and in accordance with the method of the present invention, lead frames 10 and 10' as described hereinabove sandwich therebetween a central layer of strip of insulating material 28, and in turn, lead frames 10 and 10' are sandwiched between two strips of top and bottom insulating materials 30 and 32. All three insulating strips or layers 28, 30 and 32 are comprised of a suitable insulative polymeric material (i.e., Kapton, Ultem, etc.) and are provided with an adhesive coating (i.e., epoxy or other suitable adhesive material) on the respective surfaces which will contact lead frames 10 and 10'. Central insulative strip 28 is provided with a plurality of windows or openings 34 which will provide access to exposed portions of both conductors 14 and 14'. It will be appreciated that each window 34 of central insulative strip 28 will define a cavity or recess 36 which is configured to accept a multi-layer capacitor chip therein. After the lead frames 10 and 10'; insulative strips 28, 30 and 32 and capacitor chips 38 are assembled as shown in FIG. 2, the components are heat tacked and hot press laminated to form the laminated assembly of FIGS. 5 and 6.

Figure 4:
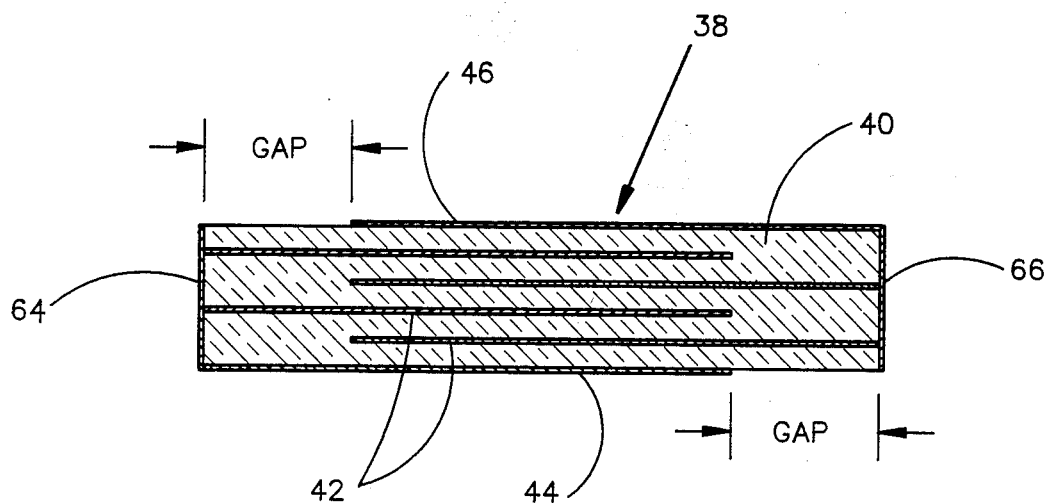
FIG. 4 is a cross-sectional elevation view of the MLC of FIG. 3 along the line 4—4.

An important feature of the present invention is the use of a specially configured novel multi-layer ceramic capacitor chip (MLC) identified at 38 in FIGS. 2-4. MLC 38 is comprised of a ceramic body 40 having interleaved layers of conductive electrodes 42. However, as will be discussed in greater detail hereinafter, unlike MLC's of conventional design, MLC 38 has its outermost electrodes 44 and 46 exposed to define top (electrode 46) and bottom (electrode 44) connecting surfaces. It will be appreciated that the actual number of interleaved layers of ceramic and metallization will depend upon the degree of desired capacitance.

Figure 5:
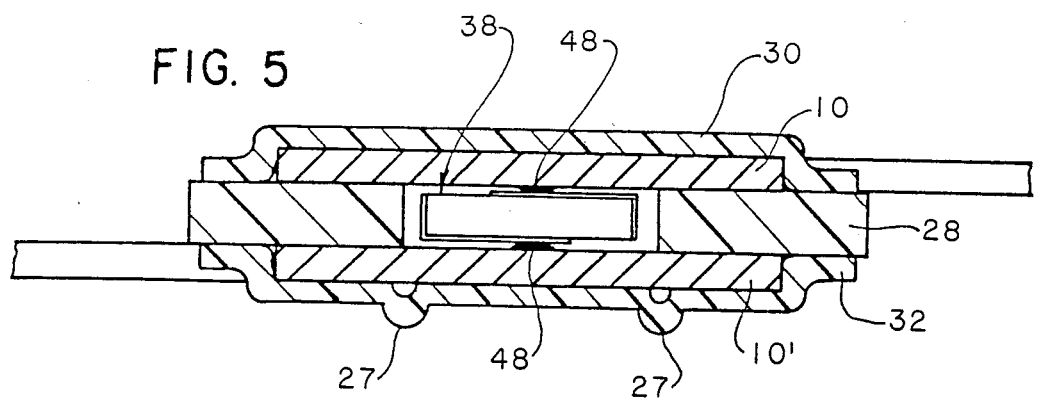
FIG. 5 is an enlarged cross-sectional elevation view of a portion of the decoupling capacitor of FIG. 2 subsequent to lamination.

Prior to assembly and lamination, drops 48 of conductive epoxy or other suitable electrically conductive adhesive material are placed on each conductor 14 and 14' as shown in FIGS. 2 and 5. During lamination, the conductive epoxy will cure to provide a strong electrical and mechanical bond between each respective top conductor 46 and bottom conductor 44 of the capacitor chip 38 and a respective top and bottom conductor 14 and 14'.

While the above discussion has been with regard to the use of a single multi-layer capacitor chip, it will be appreciated that more than one capacitor chip may be used in accordance with the present invention. It should be understood that the relative dimensioning of window 34 and cavity 36 will be varied in accordance with the number of and dimensions of the multi-layer capacitor chips which are used.

Figure 6:
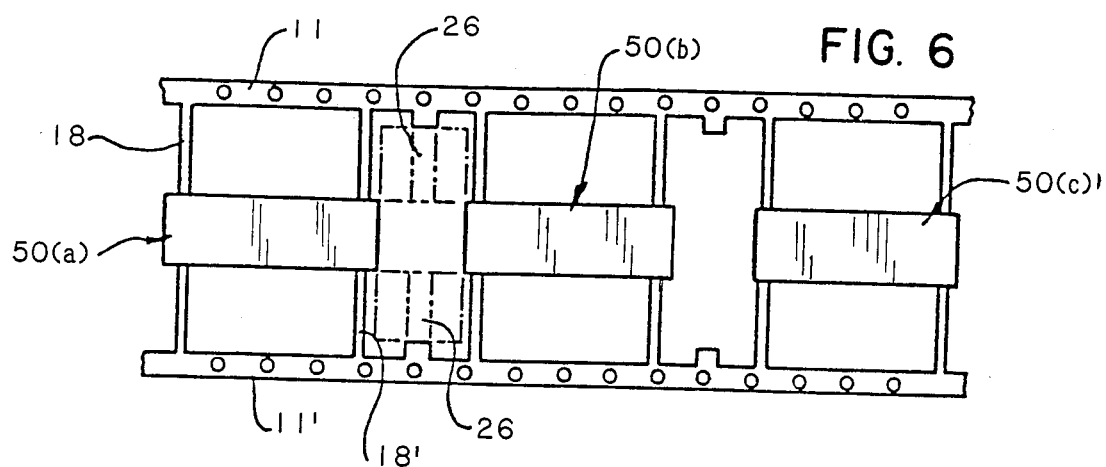
FIG. 6 is a plan view of the laminated assembly of decoupling capacitors in accordance with the present invention.
Figure 7:
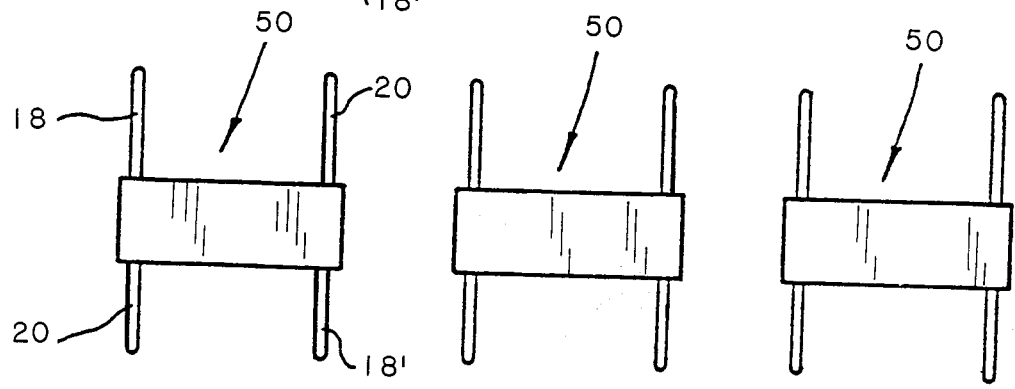
FIG. 7 is a plan view of the singulated decoupling capacitors of FIG. 6, prior to lead bending.
Figure 8:
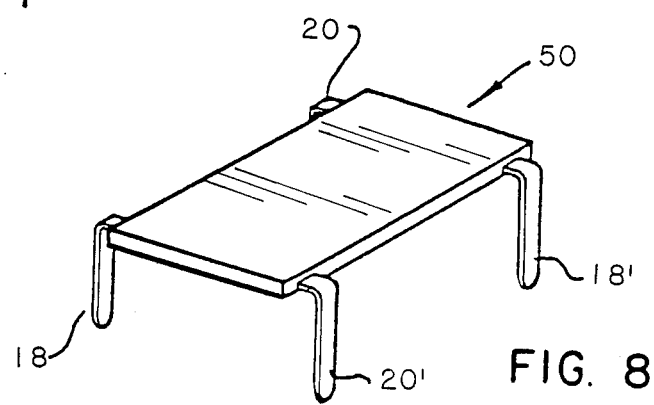
FIG. 8 is a perspective view of a finished decoupling capacitor in accordance with the present invention.

Turning now to FIGS. 6-8, the individual decoupling capacitors now identified at 50 are then separated from edge portions 11 and 11' of respective lead frames 10 and 10' by severing lateral support structures 26 and 26' and a portion of the laminated assembly as indicated by the dashed lines between decoupling capacitors 50(a) and 50(b). Thereafter, the severed material is removed as shown between capacitors 50(b) and 50(c) in FIG. 6. The electrically active leads 18 and 18' and electrically inactive "dummy" leads 20 and 20' are then singulated from laminated lead frames 10 and 10' (FIG. 7) and bent downwardly about 90 degrees as shown in FIG. 8.

The decoupling capacitor construction generally identified at 50 thus includes a pair of electrically isolated dummy leads 20 and 20' and a pair of electrically active leads 18 and 18' which are integrally attached to top and bottom conductors 14 and 14', respectively. In turn, top and bottom conductors 14 and 14' are electrically attached to top and bottom electrodes 46 and 44 of multi-layer capacitor 36. The whole assembly is laminated as discussed hereinabove with only the two electrically active leads 18 and 18' and the two electrically inactive leads 20 and 20' protruding outwardly therefrom.

As discussed, decoupling capacitor 50 utilizes a specially configured high capacitance multi-layer monolithic ceramic chip capacitor 38. Such a capacitor provides much higher capacitance values along with other desirable properties such as a flat capacitance vs. temperature characteristics, than are obtainable using convention planar single layer ceramic capacitors.

In accordance with the present invention, a pair of parallel, spaced lead frames utilizing an MLC having top and bottom conductors forms a laminated, hermetically sealed decoupling capacitor without the need for any type of molding (encapsulation) step. As a result, the disadvantages discussed hereinabove with providing consistency in molding is overcome with the process and decoupling capacitor of the present invention.

Referring again to FIGS. 3-5, while suitable for its intended purposes, multilayer capacitor chip 38 as shown therein does suffer from an important problem with regard to the conductive adhesive or solder 48 used to electrically and mechanically connect electrodes or conductors 44 and 46 to lead frames 10 and 10', respectively. Typically, MLC 38 is quite small in size (about 0.120 inch×0.180 inch or 0.150 inch×0.300 inch and between 0.013–0.015 inch in thickness). Consequently, as shown in FIG. 4, the chances of conductive adhesive or epoxy covering or bridging one or both of the gaps between electrodes 44 and 46 thus producing a short circuit are quite good. There is also a likelihood of electrical contact between lead frames 14 and 14', and end terminations 64 and 66 (see FIG. 4). It will be appreciated that this electrical contact will also produce a short circuit.

Figure 9:
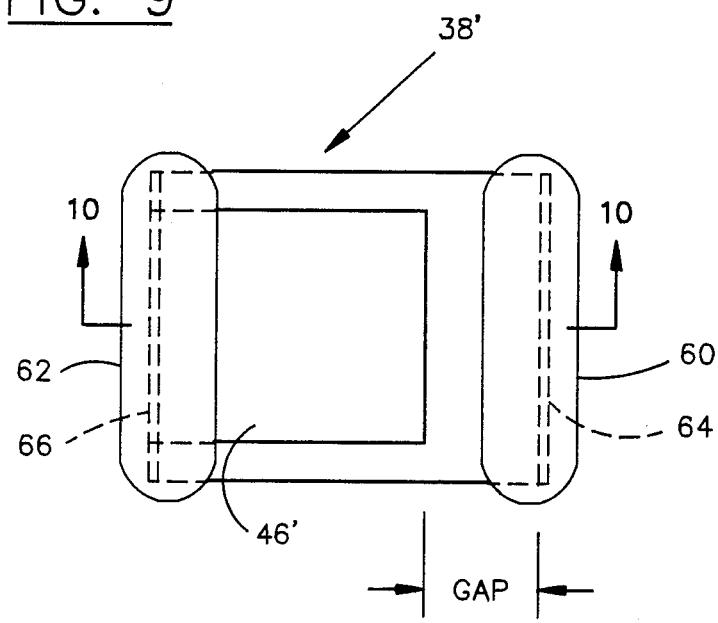
FIG. 9 is a plan view of a preferred multilayer capacitor chip (MLC) used in accordance with the present invention.
Figure 10:
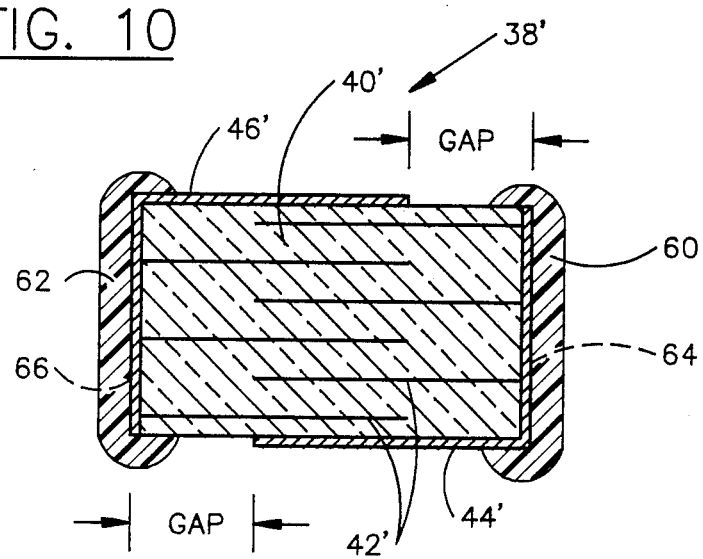
FIG. 10 is a cross-sectional elevation view of the MLC of FIG. 9 along the line 10—10.

Turning now to FIGS. 9 and 10, in a preferred embodiment, the multilayer ceramic capacitor used in accordance with the present invention is shown generally at 38' and is provided with an insulating cap 60 and 62 surrounding and encapsulating the end terminations 64 and 66 of conductors 44' and 46', respectively. It is apparent that insulative caps 60 and 62 prevent any electrical bridging in the gaps between electrodes 44 and 46 (in contrast to MLC 38 in FIGS. 3-5). As a result, the possibility of electrical shorting between electrodes 44' and 46' is eliminated, as well as the possibility of shorting between the lead frames 14 and 14' and the end terminations 64 and 66 of FIG. 4.

Insulative caps 60 and 62 may be comprised of any suitable electrically insulative material including glass or epoxy. Preferably, the insulating material should provide a hermetic seal, good adhesion and high voltage breakdown.

In a preferred method of making MLC 38', even numbers of ceramic sheets 40' with screened electrode patterns 42' are laminated together such that the external planes expose electrodes. The laminates are then cut into individual chips and fired. After firing, a thin, preferably silver end termination 64 and 66 (band width less than 0.005") is applied and fired. A second end termination 60 and 62 of dielectric glass is then applied (band width approximately 0.015") which coats and insulates the silver end termination 60 and 62. The glass is then fired to yield a finished chip. Thus, end terminations 64 and 66 essentially interconnect alternating conductive sheets 42' with the outer conductive sheets 44' and 46' defining upper and lower electrodes.

Figure 11:
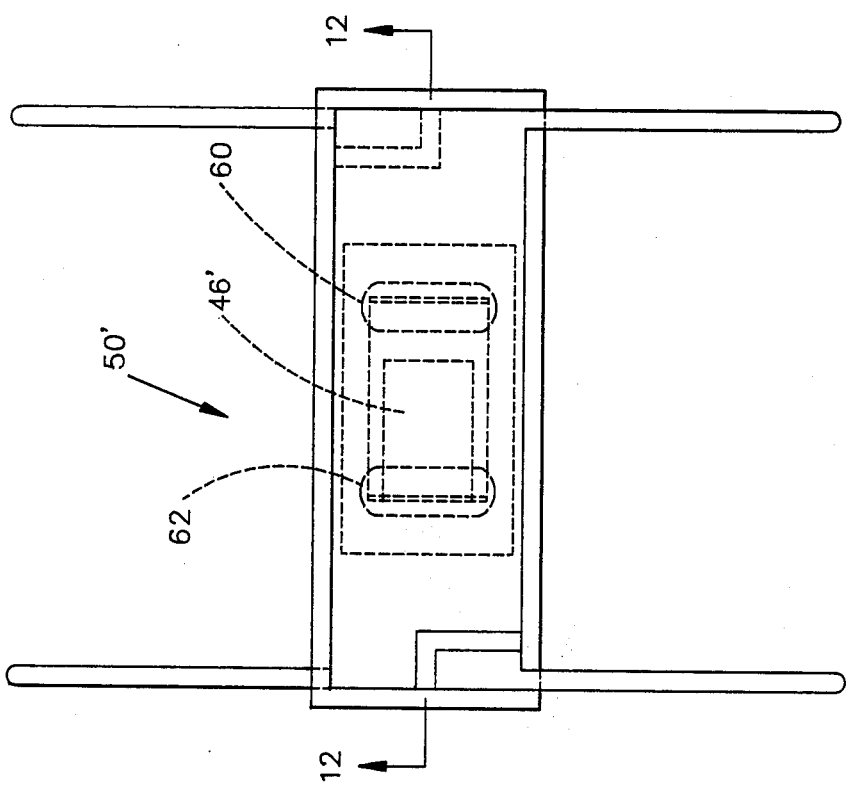
FIG. 11 is a plan view of a decoupling capacitor incorporating the MLC of FIG. 9 in accordance with the present invention.
Figure 12:
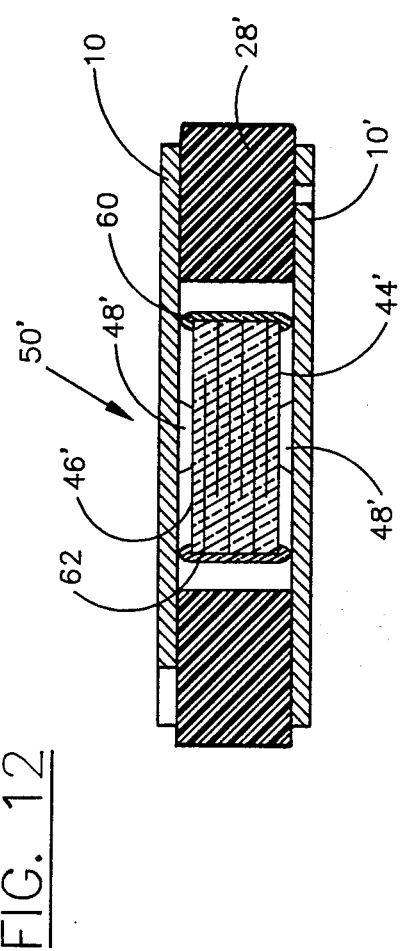
FIG. 12 is a cross-sectional elevation view along the line 12—12 of FIG. 11.

In FIGS. 11 and 12, the preferred MLC 38' of FIGS. 9 and 10 is shown after assembly in a decoupling capacitor 50'. As is evident from the FIGURES, conductive adhesive 48' is precluded from bridging the gap between electrodes 44' and 46' by insulated coatings or end caps 60 and 62.

Figure 13:
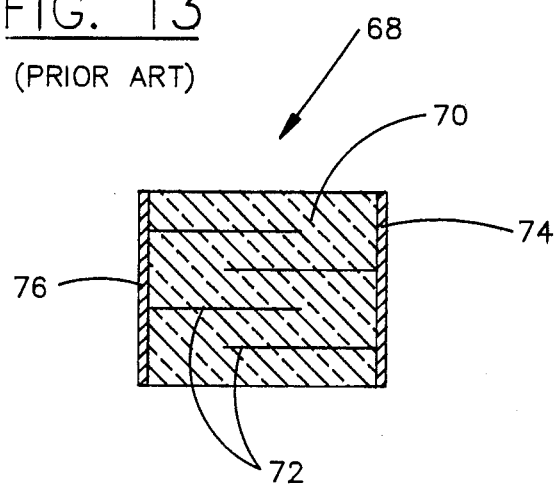
FIG. 13 is a cross-sectional elevation view of a MLC in accordance with the prior art.
Figures 14, 15:
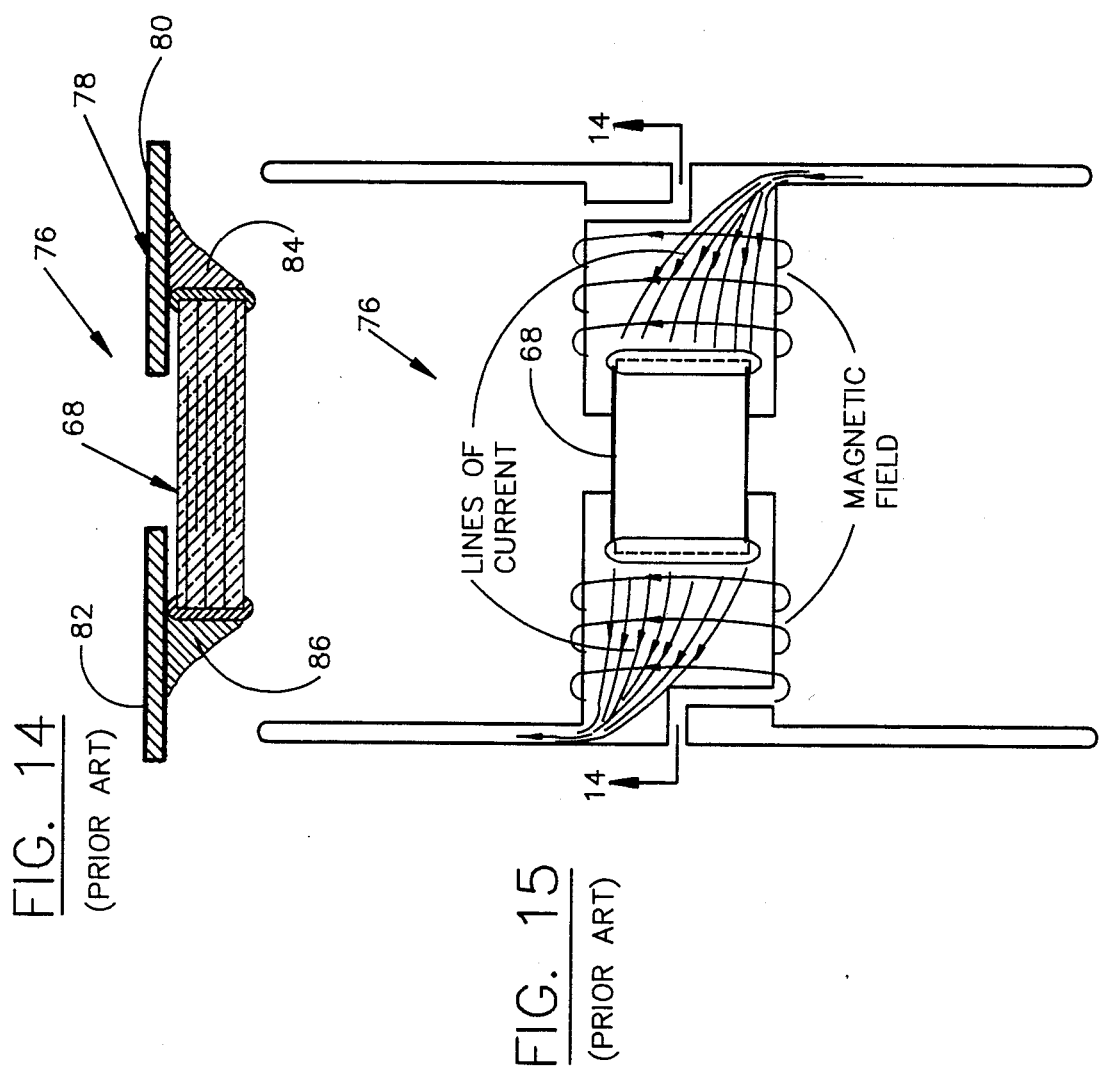
FIG. 14 is a cross-sectional view along the line 14—14 of FIG. 15 of a decoupling capacitor incorporating the MLC of FIG. 13 in accordance with the prior art.
FIG. 15 is a plan view of the decoupling capacitor of FIG. 14 in accordance with the prior art.

As previously discussed, conventional multilayer ceramic chip capacitors have utilized exposed electrodes at either end rather than the top and bottom electrode configuration of FIGS. 3, 4, 9 and 10. Such a conventional prior art MLC is shown generally at 68 in FIG. 13. Prior art MLC 68 thus includes interleaved layers of ceramic 70 and metallization 72 with alternate layers of metallization 72 terminating at end electrodes 74 and 76. In FIGS. 14 and 15, an example of a decoupling capacitor used in the prior art which utilizes a multilayer capacitor chip such as is shown in FIG. 13, is identified generally at 76. Decoupling capacitor 76 utilizes a single lead frame 78 (as contrasted to the pair of spaced lead frames used in the present invention), with MLC 68 being connected to conductors 80 and 82 of lead frame 78 by way of a pair of soldered joints 84 and 86. As shown schematically by the arrows in FIG. 15 (illustrating lines of current), portions of the lead frames 80 and 82 will act as conductors that create a magnetic field (when current is passed therethrough) which stores magnetic energy and thereby creats relatively high inductance. Thus, use of a conventional MLC 68 in conjunction with a single plane lead frame construction will provide higher inductance which is undesirable because of poor high frequency noise suppression when in actual operation in conjunction with an integrated circuit.

Figure 16:
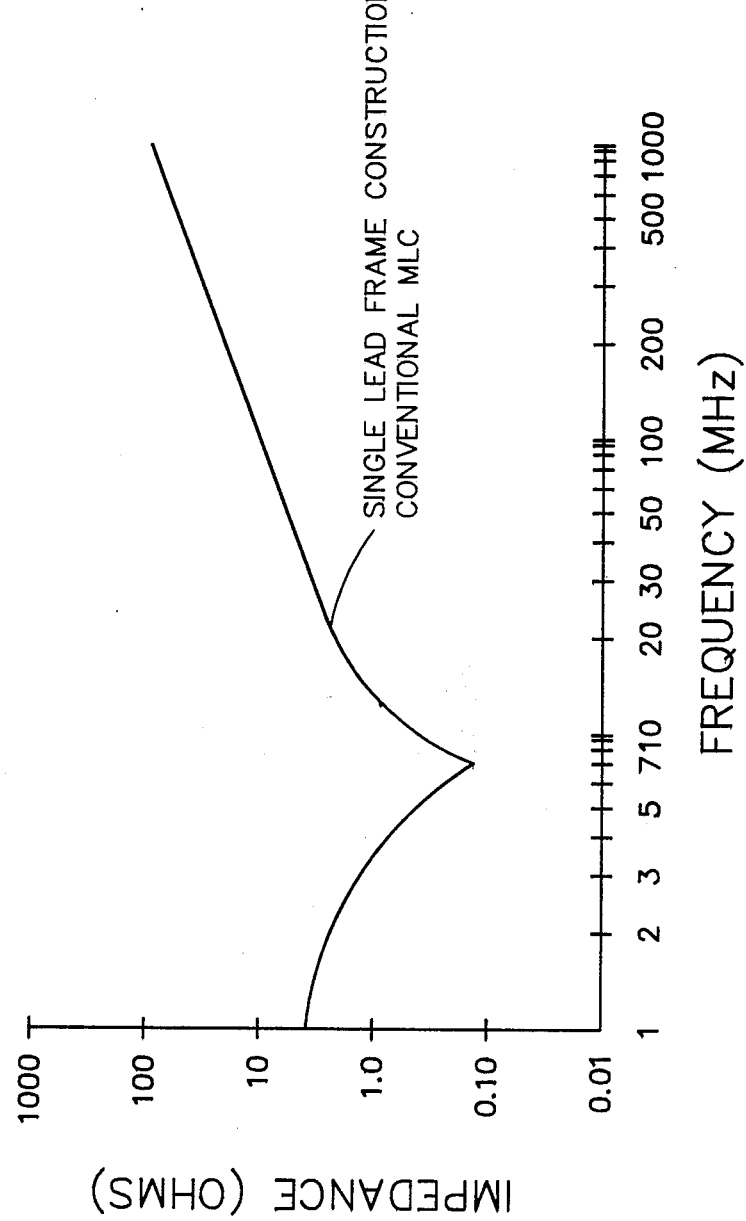
FIG. 16 is a graphical correlation of IMPEDANCE VS. FREQUENCY for the decoupling capacitor of FIGS. 14 and 15.
Figure 17:
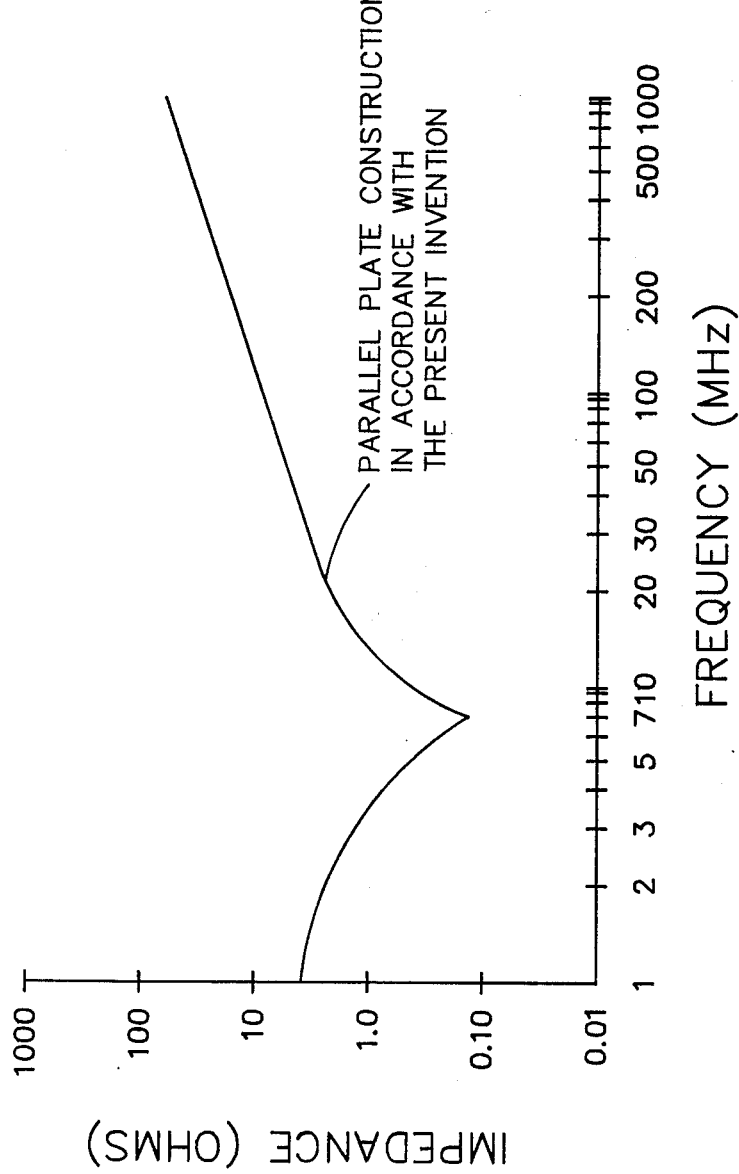
FIG. 17 is a graphical correlation of IMPEDANCE VS. FREQUENCY for the decoupling capacitor of the present invention

An important feature of the present invention is that the electrical properties, particularly the inductance of the decoupling capacitor, is greatly improved relative to the prior art construction such as shown in FIGS. 14 and 15. This improvement in electrical performance is believed to be derived from the use of the novel multilayer capacitor chip 38 and 38' in conjunction with the "parallel plate" (two lead frame) construction of the decoupling capacitor as a whole. For example, in FIGS. 16 and 17, impedance vs. frequency is plotted for the single lead frame construction/conventional MLC construction of FIGS. 14 and 15 (FIGS. 16) and the "parallel plate"/novel MLC construction of FIGS. 5 and 12. These impedance curves show that the decoupling capacitor construction of the present invention has an inductance of about 16% lower than the single lead frame/conventional MLC construction of the prior art. It will be appreciated that inductance is measured by the slope of the right side of each curve in FIGS. 16 and 17. As mentioned, this improved inductance leads to far better noise suppression at high frequencies. This improved impedance of the present invention can be supported by the theoretical considerations discussed with regard to the magnetic field shown in FIG. 15. Accordingly, from among the many possible and practical conductor structures which can be used for decoupling capacitor, the "parallel plate" construction of the present invention (including the novel MLC of the present invention) is the least "inductive". In other words, the "parallel plate" construction of the present invention stores the least magnetic energy which causes the inductive effects or inductance.

It will be appreciated that the important improved electrical performance of the present invention is not obtainable using a parallel plate decoupling capacitor construction in conjunction with a conventional MLC such as is shown in FIG. 13. This is because MLC 68 of FIG. 13 utilizes electrodes at either end (rather than top and bottom) which preclude a parallel plate construction. Only by using the novel MLC 38 or 38' wherein the electrodes are positioned along the top and bottom (and are therefore parallel to the interleaved metallization 42 or 42') may the improved electrical performance (i.e., lower inductance) be achieved.

While the novel MLC 38 and 38' has been described for use in conjunction with a decoupling capacitor, it will be appreciated that MLC 38 or 38' may also be used in any other electronic application necessitating multilayer capacitors. For example, the novel parallel plate constructed MLC's of the present invention would find utility when used in power and/or signal distribution buss bars; such as the buss bars disclosed in U.S. Pat. Nos. 4,236,038; 4,236,046; 4,266,091; 4,342,881; 4,399,321; 4,403,108 and 4,436,953 (all of which are assigned to the assignee hereof). Moreover, while MLC 38 or 38' will have relatively small dimensions when used in decoupling capacitor as described herein, the novel MLC may also be of larger sizes depending upon the particular application.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method of making a capacitor, including the steps of:
   removing unwanted material from a first strip of electrically conductive material to define a first conductor having a first active lead connected thereto and a first dummy lead associated with said first conductor, but electrically isolated therefrom;
   removing unwanted material from a second strip of electrically conductive material to define a second conductor having a second active lead connected thereto and a second dummy lead associated with said second conductor, but electrically isolated therefrom, said first and second conductive strips being spaced apart and parallel with said first and second conductors in alignment with one another;
   placing a central strip of electrically insulative material between said first and second conductors, said central insulative strip having windows therethrough wherein each of said windows define a recess communicating between said first and second conductors;
   placing at least one multi-layer capacitor element in said recess and between said first and second conductors, said capacitor element having opposed first and second conductive top and bottom surfaces, said capacitor element further comprising dielectric material having a pair of opposed end surfaces and top and bottom surfaces with said conductive top and bottom surfaces on said respective top and bottom surfaces of said dielectric material, said capacitor element also having mutually parallel interleaved conductive layers between and parallel to said conductive top and bottom surfaces, with said top conductive surface being in electrical contact with said first conductor and said bottom conductive surface being in electrical contact with said second conductor whereby said first conductor, second conductor, conductive top surface, conductive bottom surface and interleaved conductive layers are all mutually parallel, said capacitor element further comprising first and second conductive end terminations on said dielectric material end surfaces with alternating layers of said interleaved conductive layers being electrically connected and defining first and second groups of conductive layers, said first group of conductive layers terminating at said first conductive end termination and said second group of conductive layers terminating at said second conductive end termination, said top conductive surface being connected and substantially transverse to said first conductive end termination, said bottom conductive surface being connected and substantially transverse to said second conductive end termination, a first gap being defined between said top conductive surface and said second end termination and a second gap being defined between said bottom conductive surface and said first end termination, an electrically insulative cap being provided over each of said first and second conductive end terminations wherein said conductive end terminations are encapsulated and wherein electrical bridging in said gap between said top conductive surface and said second end termination and in said gap between said bottom conductive surface and said first end termination is precluded by said insulative caps;
   placing a first outer strip of electrically insulative material on said first conductor opposite said central insulative strip;
   placing a second outer strip of electrically insulative material on said second conductor opposite said central insulative strip;
   providing adhesive between said first and second conductors, first and second outer insulative strips and central insulative strip; and
   bonding the above elements to form a laminated assembly with said first and second conductors, first and second outer insulative strips and central insulative strip being bonded together.

2. The method of claim 1 including:
   providing electrically conductive adhesive between said capacitor element top conductive surface and said first conductor and said capacitor element bottom conductive surface and said second conductor.

3. The method of claim 2 wherein said electrically conductive adhesive is solder and including the step of:
   reflowing said solder after providing it between said capacitor element and said first and second conductors.

4. The method of claim 1 wherein said step of removing unwanted material from said first and second strips of electrically conductive material further includes the steps of:
   forming support structure for supporting said first and second conductors in said respective first and second conductive strips; and
   severing said support structure.

5. The method of claim 1 wherein said step of removing unwanted material from said electrically conductive material further includes the steps of:
   forming support structure for supporting said first and second leads and said dummy leads in said respective first and second conductive strips; and
   severing said support structure.

6. The method of claim 1 including:
   forming registration holes in said strips of electrically conductive material.

7. The method of claim 1 wherein:
   said active leads are at a first pair of diagonally opposed locations and said dummy leads are at a second pair of diagonally opposed locations.

8. The method of claim 1 wherein:
   said dielectric material of said capacitor element is a ceramic material.

9. The method of claim 1 including the step of:
   providing set-off means in said laminated assembly.

10. The method of claim 1 including the further step of:
    severing said laminated assembly from said first and second conductive strips.

11. The method of claim 1 wherein said windows are substantially rectangular.

12. The method of claim 1 wherein the bonding step comprises the steps of:
    heat tracking the elements; and
    hot press laminating the elements.

13. A capacitor including:
    a first electrical conductor;
    a second electrical conductor spaced from and in alignment with said first conductor;
    a first active lead extending from said first conductor at a first position;

a second active lead extending from said second conductor at a second position;

a first dummy lead associated with said first conductor, but electrically isolated therefrom at a third position;

a second dummy lead associated with said second conductor, but electrically isolated therefrom at a fourth position;

central electrically insulative material between said first and second conductors, said central insulative material having a window therethrough wherein said window defines a recess communicating between said first and second conductors;

at least one multi-layer capacitive element in said recess and between said first and second conductors, said capacitive element having opposed first and second conductive top and bottom surfaces, said capacitive element further comprising dielectric material having a pair of opposed end surfaces and top and bottom surfaces with said conductive top and bottom surfaces on said respective top and bottom surfaces of said dielectric material, said capacitive element also having mutually parallel interleaved conductive layers between and parallel to said conductive top and bottom surfaces, with said top conductive surface being in electrical contact with said first conductor and said bottom conductive surface being in electrical contact with said second conductor whereby said first conductor, second conductor, conductive top surface, conductive bottom surface and interleaved conductive layers are all mutually parallel;

first and second conductive end terminations on said dielectric material end surfaces with alternating layers of said interleaved conductive layers being electrically connected and defining first and second groups of conductive layers, said first group of conductive layers terminating at said first conductive end termination and said second group of conductive layers terminating at said second conductive end termination, said top conductive surface being connected and substantially transverse to said first conductive end termination, said bottom conductive surface being connected and substantially transverse to said second conductive end termination, a first gap being defined between said top conductive surface and said second end termination and a second gap being defined between said bottom conductive surface and said first end termination;

an electrically insulative cap being provided over each of said first and second conductive end terminations wherein said conductive end terminations are encapsulated and wherein electrical bridging in said gap between said top conductive surface and said second end termination and in said gap between said bottom conductive surface and said first end termination is precluded by said insulative caps;

electrically insulative material on said first conductor opposite said central insulative material;

electrically insulative material on said second conductor opposite said central insulative material and;

wherein the above elements are bonded together to form a laminated assembly.

14. The capacitor of claim 13 wherein said elements are bonded together with an adhesive.

15. The capacitor of claim 13 wherein:
said top and bottom conductive surfaces of said capacitive element are bonded to said first and second conductors, respectively.

16. The capacitor of claim 15 wherein:
said bonding of said top and bottom conductive surfaces of said capacitive element is by conductive adhesive.

17. The capacitor of claim 13 wherein:
said active leads are at a first pair of diagonally opposed locations and said dummy leads are at a second pair of diagonally opposed locations.

18. The capacitor of claim 13 wherein:
said dielectric material of said capacitive element is a ceramic material.

19. The capacitor of claim 13 wherein:
said cap is comprised of a material selected from the group comprising glass and epoxy.

20. The capacitor of claim 13 including:
set-off means on said laminated assembly.

21. The capacitor of claim 13 wherein:
said windows are subtantially rectangular.

22. An array of capacitors positioned between a pair of edge strips from which a pair of conductors and active and dummy leads of the capacitors are formed, each of said capacitors having:

a first electrical conductor;

a second electrical conductor spaced from and in alignment with said first conductor;

a first active lead extending from said first conductor at a first position;

a second active lead extending from said second conductor at a second position;

a first dummy lead associated with said first conductor, but electrically isolated therefrom at a third position;

a second dummy lead associated with said second conductor, but electrically isolated therefrom at a fourth position;

central electrically insulative material between said first and second conductors, said central electrically insulative material having a window therethrough wherein said window defines a recess communicating between said first and second conductors;

at least one multi-layer capacitive element in said recess and between said first and second conductors, said capacitive element having opposed first and second conductive top and bottom surfaces, said capacitive element further comprising dielectric material having a pair of opposed end surfaces and top and bottom surfaces with said conductive top and bottom surfaces on said respective top and bottom surfaces of said dielectric material, said capacitive element also having mutually parallel interleaved conductive layers between and parallel to said conductive top and bottom surfaces, with said top conductive surface being in electrical contact with said first conductor and said bottom conductive surface being in electrical contact with said second conductor whereby said first conductor, second conductor, conductive top surface, conductive bottom surface and interleaved conductive layers are all mutually parallel;

first and second conductive end terminations on said dielectric material end surfaces with alternating layers of said interleaved conductive layers being electrically connected and defining first and second groups of conductive layers, said first group of conductive layers terminating at said first conductive end termination and said second group of conductive layers terminating at said second conductive end termination, said top conductive surface being connected and substantially transverse to said first conductive end termination, said bottom conductive surface being connected and substantially transverse to said second conductive end termination, a first gap being defined between said top conductive surface and said second end termination and a second gap being defined between said bottom conductive surface and said first end termination;

an electrically insulative cap being provided over each of said first and second conductive end terminations wherein said conductive end terminations are encapsulated and wherein electrical bridging in said gap between said top conductive surface and said second end termination and in said gap between said bottom conductive surface and said first end termination is precluded by said insulative caps;

electrically insulative material on said first conductor opposite said central insulative material;

electrically insulative material on said second conductor opposite said central insulative material; and wherein the above elements are bonded together to form a laminated assembly.

23. The array of capacitors of claim 22 wherein said elements are bonded together with an adhesive.

24. The array of capacitors of claim 22 wherein:
said top and bottom conductive surfaces of said capacitive element are bonded to said first and second conductors, respectively.

25. The array of capacitors 24 wherein:
said bonding of said top and bottom conductive surfaces of said capacitive element is by conductive adhesive.

26. The array of capacitors of claim 22 wherein:
said active leads are at a first pair of diagonally opposed locations and said dummy leads are at a second pair of diagonally opposed locations.

27. The array of capacitors 22 wherein:
said dielectric material of said capacitive element is a ceramic material.

28. The array of capacitors of claim 22 wherein:
said cap is comprised of a material selected from the group comprising glass and epoxy.

29. The array of capacitors of claim 22 including:
set-off means on said laminated assembly.

30. The array of capacitors of claim 22 wherein:
said windows are subtantially rectangular.

31. A multi-layer capacitor element comprising:
dielectric material having a pair of opposed end surfaces and having top and bottom surfaces;

a plurality of parallel conductive layers interleaved within said dielectric material with alternating layers of conductive material being electrically connected and defining first and second groups of conductive layers, said first group having at least one exposed conductive layer on said top surface of said dielectric material defining a first exposed conductive layer and said second group having at least one exposed conductive layer on said bottom surface of said dielectric material defining a second exposed conductive layer;

a first conductive end termination on one of said opposed end surfaces of said dielectric material and a second conductive end termination on the other of said opposed end surfaces of said dielectric material;

said first group of conductive layers terminating at said first conductive end termination and said second group of conductive layers terminating at said second conductive end termination, said first exposed conductive layer being connected and substantially transverse to said first conductive end termination, said second exposed conductive layer being connected and substantially transverse to said second conductive end termination, a first gap being defined between said first exposed conductive layer and said second end termination and a second gap being defined between said second exposed conductive layer and said first end termination; and an electrically insulative cap being provided over each of said first and second conductive end terminations wherein said conductive end terminations are encapsulated and wherein electrical bridging in said first gap between said first exposed conductive layer and said second conductive end termination and in said second gap between said second exposed conductive layer and said first conductive end termination is precluded by said insulative caps.

32. The multi-layer capacitor element of claim 31 wherein:
said insulative cap is comprised of a material selected from the group comprising glass and epoxy.

33. The capacitor of claim 31 wherein:
said dielectric material is a ceramic material.

34. A multi-layer capacitive element comprising:
interleaved layers of conductive material and dielectric material with alternating layers of conductive material being electrically connected and defining first and second groups of conductive layers, said first group having at least one exposed conductive layer defining a first exposed conductive layer and said second group having at least one exposed conductive layer defining a second exposed conductive layer, said first and second groups of conductive layers being mutually parallel to each other;

said dielectric material including a pair of opposed end surfaces and top and bottom surfaces, said first exposed conductive layer being disposed on said top surface and said second exposed conductive layer being disposed on said bottom surface;

a first conductive end termination on one of said opposed end surfaces of said dielectric material and a second conductive end termination on the other of said opposed end surfaces of said dielectric material;

said first group of alternating conductive layers terminating at said first conductive end termination and said second group of alternating conductive layers terminating at said second conductive end termination, said first exposed conductive layer being connected and substantially transverse to said first conductive end termination, said second exposed conductive layer being connected and substantially transverse to said second conductive end termination, a first gap being defined between said first exposed conductive layer and said second end termination and a second gap being defined between said second exposed conductive layer and said second end termination; and an electrically insulative cap being provided over each of said first and second conductive end terminations wherein said conductive end terminations are encapsulated and wherein electrical bridging in said first gap between said first exposed conductive layer and said second conductive end termination and in said second gap between said second exposed conductive layer and said first conductive end termination is precluded by said insulative caps.

35. The multi-layer capacitive element of claim 34 wherein:
said insulative cap is comprised of a material selected from the group comprising glass and epoxy.

36. The multi-layer capacitive element of claim 34 wherein:
said dielectric material is a ceramic material.

37. A method of making a capacitor, including the steps of:
removing unwanted material from a first strip of electrically conductive material to define a first conductor having at least a first lead connected thereto;
removing unwanted material from a second strip of electrically conductive material to define a second conductor having at least a second lead connected thereto, said first and second conductive strips being spaced apart and parallel with said first and second conductors in alignment with one another;
placing a central strip of electrically insulative material between said first and second conductors, said central insulative strip having windows therethrough wherein each of said windows define a recess communicating between said first and second conductors;
placing at least one multi-layer capacitor element in said recess and between said first and second conductors, said capacitor element having opposed first and second conductive top and bottom surfaces, said capacitor element further comprising dielectric material having a pair of opposed end surfaces and top and bottom surfaces with said conductive top and bottom surfaces on said respective top and bottom surfaces of said dielectric material, said capacitor element also having mutually parallel interleaved conductive layers between and parallel to said conductive top and bottom surfaces, with said top conductive surface being in electrical contact with said first conductor and said bottom conductive surface being in electrical contact with said second conductor whereby said first conductor, second conductor, conductive top surface, conductive bottom surface and interleaved conductive layers are all mutually parallel, said capacitor element further comprising first and second conductive end terminations on said dielectric material end surfaces with alternating layers of said interleaved conductive layers being electrically connected and defining first and second groups of conductive layers, said first group of conductive layers terminating at said first conductive end termination and said second group of conductive layers terminating at said second conductive end termination, said top conductive surface being connected and substantially transverse to said first conductive end termination, said bottom conductive surface being connected and substantially transverse to said second conductive end termination, a first gap being defined between said top conductive surface and said second end termination and a second gap being defined between said bottom conductive surface and said first end termination, an electrically insulative cap being provided over each of said first and second conductive end terminations wherein said conductive end terminations are encapsulated and wherein electrical bridging in said gap between said top conductive surface and said second end termination and in said gap between said bottom conductive surface and said first end termination is precluded by said insulative caps;

placing a first outer strip of electrically insulative material on said first conductor opposite said central insulative strip;
placing a second outer strip of electrically insulative material on said second conductor opposite said central insulative strip;
providing adhesive between said first and second conductors, first and second outer insulative strips and central insulative strip; and
bonding the above elements to form a laminated assembly with said first and second conductors, first and second outer insulative strips and central insulative strip being bonded together.

38. The method of claim 37 including:
providing electrically conductive adhesive between said capacitor element top conductive surface and said first conductor and said capacitor element bottom conductive surface and said second conductor.

39. The method of claim 38 wherein said electrically conductive adhesive is solder and including the step of:
reflowing said solder after providing it between said capacitor element and said first and second conductors.

40. The method of claim 37 wherein said step of removing unwanted material from said first and second strips of electrically conductive material further includes the steps of:
forming support structure for supporting said first and second conductors in said respective first and second conductive strips; and
severing said support structure.

41. The method of claim 37 wherein said step of removing unwanted material from said electrically conductive material further includes the steps of:
forming support structure for supporting said first and second leads in said respective first and second conductive strips; and
severing said support structure.

42. The method of claim 37 including:
forming registration holes in said strips of electrically conductive material.

43. The method of claim 37 wherein:
said dielectric material of said capacitor element is a ceramic material.

44. The method of claim 37 including the step of:
providing set-off means in said laminated assembly.

45. The method of claim 37 including the further step of:
severing said laminated assembly from said first and second conductive strips.

46. The method of claim 37 wherein said windows are substantially rectangular.

47. The method of claim 37 wherein the bonding step comprises the steps of:
   heat tracking the elements; and
   hot press laminating the elements.

48. A capacitor including:
   a first electrical conductor;
   a second electrical conductor spaced from an in alignment with said first conductor;
   at least a first lead extending from said first conductor;
   at least a second lead extending from said second conductor;
   central insulative material between said first and second conductors, said central insulative material having a window therethrough wherein said window defines a recess communicating between said first and second conductors;
   at least one multi-layer capacitive element in said recess and between said first and second conductors, said capacitive element having opposed first and second conductive top and bottom surfaces, said capacitive element further comprising dielectric material having a pair of opposed end surfaces, opposed top and bottom surfaces and a pair of opposed side surfaces, with said conductive top and bottom surfaces on said respective top and bottom surfaces of said dielectric material, said capacitive element also having mutually parallel interleaved conductive layers between and parallel to said conductive top and bottom surfaces, with said top conductive surface being in electrical contact with said first conductor and said bottom conductive surface being in electrical contact with said second conductor whereby said first conductor, second conductor, conductive top surface, conductive bottom surface and interleaved conductive layers are all mutually parallel;
   first and second conductive end terminations on said dielectric material end surfaces with alternating layers of said interleaved conductive layers being electrically connected and defining first and second groups of conductive layers, said first group of conductive layers terminating at said first conductive end termination and said second group of conductive layers terminating at said second conductive end termination, said top conductive surface being connected and substantially transverse to said first conductive end termination, said bottom conductive surface being connected and substantially transverse to said second conductive end termination, a first gap being defined between said top conductive surface and said second end termination and a second gap being defined between said bottom conductive surface and said first end termination;
   an electrically insulative cap being provided over each of said first and second conductive end terminations wherein said conductive end terminations are encapsulated and wherein electrical bridging in said gap between said top conductive surface and said second end termination and in said gap between said bottom conductive surface and said first end termination is precluded by said insulative caps;
   electrically insulative material on said first conductor opposite said central insulative material; and
   electrically insulative material on said second conductor opposite said central insulative material; and
   wherein the above elements are bonded together to form a laminated assembly.

49. The capacitor of claim 48 wherein said elements are bonded together with an adhesive.

50. The capacitor of claim 48 wherein:
   said top and bottom conductive surfaces of said capacitive element are bonded to said first and second conductors, respectively.

51. The capacitor of claim 50 wherein:
   said bonding of said top and bottom conductive surfaces of said capacitive element is by conductive adhesive.

52. The capacitor of claim 48 wherein:
   said dielectric material of said capacitive element is a ceramic material.

53. The capacitor of claim 48 wherein:
   said cap is comprised of a material selected from the group comprising glass and epoxy.

54. The capacitor of claim 48 including:
   set-off means in said laminated assembly.

55. The capacitor of claim 48 wherein:
   said windows are substantially rectangular.

56. An array of capacitors positioned between a pair of edge strips from which a pair of conductors and leads of the capacitors are formed, each of said capacitors having:
   a first electrical conductor;
   a second electrical conductor spaced from and in alignment with said first conductor;
   a first lead extending from said first conductor;
   a second lead extending from said second conductor;
   central electrically insulative material between said first and second conductors, said central electrically insulative material having a window therethrough wherein said window defines a recess communicating between said first and second conductors;
   at least one multi-layer capacitive element in said recess and between said first and second conductors, said capacitive element having opposed first and second conductive top and bottom surfaces, said capacitive element further comprising dielectric material having a pair of opposed end surfaces and top and bottom surfaces with said conductive top and bottom surfaces on said respective top and bottom surfaces of said dielectric material, said capacitive element also having mutually parallel interleaved conductive layers between and parallel to said conductive top and bottom surfaces, with said top conductive surface being in electrical contact with said first conductor and said bottom conductive surface being in electrical contact with said second conductor whereby said first conductor, second conductor, conductive top surface, conductive bottom surface and interleaved conductive layers are all mutually parallel;
   first and second conductive end terminations on said dielectric material end surfaces with alternating layers of said interleaved conductive layers being electrically connected and defining first and second groups of conductive layers, said first group of conductive layers terminating at said first conductive end termination and said second group of conductive layers terminating at said second conductive end termination, said top conductive surface being connected and substantially transverse to said first conductive end termination, said bottom conductive surface being connected and substantially transverse to said second conductive end termination, a first gap being defined between said top conductive surface and said second end termination and a second gap being defined between said bottom conductive surface and said first end termination;

an electrically insulative cap being provided over each of said first and second conductive end terminations wherein said conductive end terminations are encapsulated and wherein electrical bridging in said gap between said top conductive surface and said second end termination and in said gap between said bottom conductive surface and said first end termination is precluded by said insulative caps;

electrically insulative material on said first conductor opposite said central insulative material;

electrically insulative material on said second conductor opposite said central insulative material; and wherein the above elements are bonded together to form a laminated assembly.

57. The array of capacitors 56 wherein said elements are bonded together with an adhesive.

58. The array of capacitors of claim 56 wherein:
said top and bottom conductive surfaces of said capacitive element are bonded to said first and second conductors, respectively.

59. The array of capacitors of claim 56 wherein:
said bonding of said top and bottom conductive surfaces of said capacitive element is by a conductive adhesive.

60. The array of capacitors of claim 56 wherein:
said dielectric material of said capacitive element is a ceramic material.

61. The array of capacitors of claim 56 wherein:
said cap is formed of a material selected from the group consisting of glass and epoxy.

62. The array of capacitors of claim 56 including:
set-off means in said laminated assembly.

63. The capacitor of claim 56 wherein:
said windows are substantially rectangular.

* * * * *